(12) United States Patent
Oh

(10) Patent No.: US 6,191,370 B1
(45) Date of Patent: Feb. 20, 2001

(54) BALL GRID ARRAY SEMICONDUCTOR PACKAGE AND METHOD OF FABRICATING THE SAME

(75) Inventor: Sung Ho Oh, Seoul (KR)

(73) Assignee: LG Semicon Co., Ltd., Choongcheongbuk-Do (KR)

( * ) Notice: Under 35 U.S.C. 154(b), the term of this patent shall be extended for 0 days.

(21) Appl. No.: 09/246,948

(22) Filed: Feb. 9, 1999

(30) Foreign Application Priority Data

May 30, 1998 (KR) .................................................. 20097/98

(51) Int. Cl.[7] ........................................................ H05K 1/16
(52) U.S. Cl. .............................. 174/260; 361/783; 29/841
(58) Field of Search .................................... 174/260, 263; 361/785, 784, 790, 803, 760, 783; 257/777; 29/841

(56) References Cited

U.S. PATENT DOCUMENTS

| | | | |
|---|---|---|---|
| 3,148,310 | * 9/1964 | Feldman | 174/265 |
| 4,394,712 | * 7/1983 | Anthony | 361/411 |
| 5,129,142 | * 7/1992 | Bindra et al. | 29/852 |
| 5,266,912 | * 11/1993 | Kledzik | 333/247 |
| 5,329,423 | * 7/1994 | Scholz | 361/760 |
| 5,642,261 | 6/1997 | Bond et al. | 361/704 |
| 5,896,276 | * 4/1999 | Tamura et al. | 361/767 |

\* cited by examiner

Primary Examiner—Jeffrey Gaffin
Assistant Examiner—Jeremy Norris
(74) Attorney, Agent, or Firm—Morgan, Lewis & Bockius LLP

(57) ABSTRACT

A ball grid array semiconductor package includes a first substrate having a plurality of first holes and a recess, a second substrate having a plurality of second holes and a third hole, a plurality of conductive balls connecting the first and second substrates by filling the first and second holes, a semiconductor chip on the recess of the first substrate, a first conductive wiring portion electrically connecting the semiconductor chip and the conductive balls, and an encapsulating member encapsulating the semiconductor chip.

27 Claims, 4 Drawing Sheets

BALL GRID ARRAY SEMICONDUCTOR PACKAGE AND METHOD OF FABRICATING THE SAME

This application claims the benefit of Korean Application Number 20097/1998 filed May 30, 1998, which is hereby incorporated by reference.

BACKGROUND OF THE INVENTION

1. Field of the Invention

The present invention relates to a semiconductor device, and more particularly, to a ball grid array (BGA) semiconductor package and a method of fabricating the same. Although the present invention is suitable for a wide scope of applications, it is particularly suitable for increasing a mounting density in a stackable BGA semiconductor package.

2. Discussion of the Related Art

As a semiconductor device becomes increasingly smaller, thinner, and lighter, a high-density semiconductor package has been widely studied to mount more semiconductor chips in one package. A stacked TSOP (thin small outline package) has been used to mount a high capacity semiconductor chip since it has a thickness about one half of a related BGA semiconductor package.

The related BGA package has a wide lead pitch and a resistance to an external lead from an external impact. Also, a mass production is readily realized with this type of BGA package. However, a stackable package can not be fabricated using the structure of the related BGA package.

FIG. 1 is a cross-sectional view illustrating the structure of the related BGA semiconductor package. As shown therein, the BGA semiconductor package includes a substrate 1 having a plurality of through holes 3. Interconnection portions 5 are formed on upper and lower surfaces of the substrate in a predetermined pattern and filled into the through holes 3. A is semiconductor chip 7 is attached on a center portion of the upper surface of the substrate 1. A plurality of wires 9 connecting a plurality of pads (not shown) are formed on one side surface of the semiconductor chip 7. The interconnection portions 5 are also formed on the upper surface of the substrate 1. A solder resist 11 covers the upper and lower surfaces of the substrate 1 and the portions of the upper and lower surfaces of the interconnection portions 5. A molding body 13 is embedding the semiconductor chip 7 and the wires 9, and a plurality of solder balls 15 are respectively connected with the lower ends of the interconnection wires 5.

In the above related BGA package, it is impossible to fabricate a stackable package by stacking a plurality of BGA packages since the solder balls are formed on the lower surface of the substrate due to its design limitations. In addition, the above BGA semiconductor package has a lower mounting density compared to other stackable packages having the identical mounting area.

SUMMARY OF THE INVENTION

Accordingly, the present invention is directed to a BGA semiconductor package and a method of fabricating the same that substantially obviate one or more of the problems due to limitations and disadvantages of the related art. Another object of the present invention to provide a BGA semiconductor package and a method of fabricating the same which are capable of fabricating a stackable BGA semiconductor package having a high mounting density.

Additional features and advantages of the invention will be set forth in the description which follows and in part will be apparent from the description, or may be learned by practice of the invention. The objectives and other advantages of the invention will be realized and attained by the structure particularly pointed out in the written description and claims hereof as well as the appended drawings.

To achieve these and other above objects, there is provided a BGA semiconductor package which includes a lower substrate including an insulation substrate having a predetermined-shaped recess formed on a center upper surface of the same, a plurality of lower through holes, each of said lower through holes having an upper entrance portion having a larger diameter compared to that of a lower entrance portion and being formed on the insulation substrate except on the recess, and a plurality of predetermined-shaped conductive wiring portions formed on an upper surface of the insulation substrate, a semiconductor chip mounted on the recess by an adhesive, wires connecting the wiring portions and a plurality of pads, an encapsulating member encapsulating the wires, the semiconductor chip and the recess; a plurality of conductive balls each placed on a corresponding one of the lower through holes, and an upper substrate including a through portion formed on a portion corresponding to the encapsulating member, and a plurality of upper through holes, each of said upper through holes being formed at a portion corresponding to a corresponding one of the conductive balls and having an upper entrance portion narrower than the lower entrance portion, whereby the upper substrate is stackable on the lower substrate.

In another aspect of the present invention, a BGA semiconductor package fabrication method includes the steps of preparing a lower substrate having an insulation substrate having a recess formed at a center portion of the same, a plurality of lower insulation substrates formed on the insulation substrate except for the recess and having an upper portion wider than a lower portion and a conductive wiring portion formed on the upper surface of the insulation substrate, attaching a semiconductor chip on the recess, wiring the pads of the semiconductor chip to the wiring portions using a wire, encapsulating the semiconductor chip, the wire and the recess using an encapsulating member, mounting conductive balls on the lower through holes, and bonding a frame type upper substrate having through holes formed at a center portion of the same and a lower substrate wherein upper through holes each have an upper portion of the same wider than a lower portion of the same, and the upper through holes are formed to correspond with the lower through holes.

In another aspect of the present invention, a ball grid array semiconductor package includes a first substrate having a plurality of first holes and a recess, a second substrate having a plurality of second holes and a third hole, a plurality of conductive balls connecting the first and second substrates by filling the first and second holes, a semiconductor chip on the recess of the first substrate, a first conductive wiring portion electrically connecting the semiconductor chip and the conductive balls, and an encapsulating member encapsulating the semiconductor chip.

In another aspect of the present invention, a stackable ball grid array semiconductor package includes a first substrate having a plurality of first holes and a first recess, a second substrate having a plurality of second holes and a third hole, a plurality of first conductive balls filling the first and second holes, a first semiconductor chip on the first recess, a first conductive wiring portion electrically connecting the first semiconductor chip and the first conductive balls, a first encapsulating member encapsulating the first semiconductor chip, a third substrate having a plurality of fourth holes and a second recess, a fourth substrate having a plurality of fifth holes and sixth a hole, a plurality of second conductive balls filling the first and second holes, the first and second conductive balls being electrically connected each other, a second semiconductor chip on the second recess, a third conductive wiring portion electrically connecting the second semiconductor chip and the second conductive balls, and a second encapsulating member encapsulating the second semiconductor chip.

In a further aspect of the present invention, a method of fabricating a ball grid array semiconductor package, the method comprising the steps of preparing first and second substrates, the first substrate having a plurality of first holes and a first recess, and the second substrate having a plurality of second holes and a third hole, attaching a first semiconductor chip on the first recess of the first substrate, electrically connecting the first semiconductor chip to a first conductive wiring portion, encapsulating the first semiconductor chip using a first encapsulating member, mounting a plurality of first conductive balls on the first and second substrates through the first holes, and bonding the first and second substrates to form a first semiconductor package.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the inventing and together with the description serve to explain the principle of the invention.

In the drawings.

DETAILED DESCRIPTION OF THE PREFERRED EMBODIMENTS

Reference will now be made in detail to the preferred embodiments of the present invention, examples of which are illustrated in the accompanying drawings.

In the BGA semiconductor package according to the present invention, a plurality of conductive balls may protrude from the upper and lower surfaces of a substrate, thereby perpendicularly stacking a plurality of packages. Thus, it increases a package mounting density of a semiconductor chip.

Figure 1:
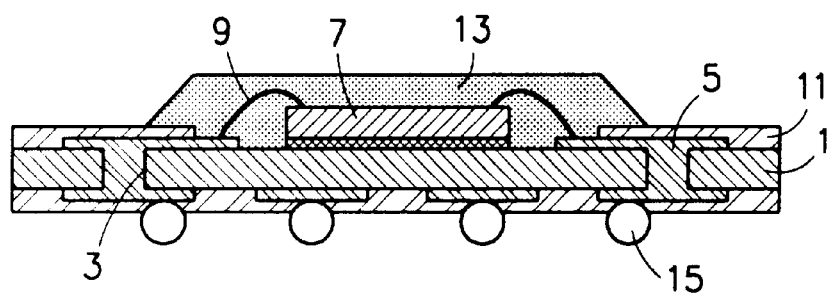
FIG. 1 is a cross-sectional view illustrating a background art BGA semiconductor package.
Figure 2:
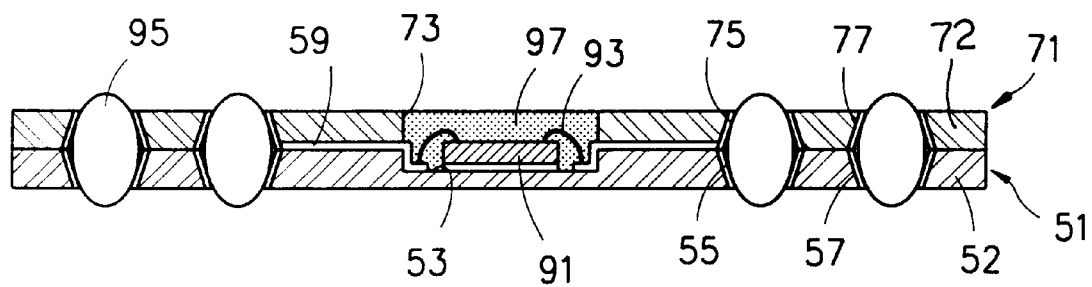
FIG. 2 is a cross-sectional view illustrating a BGA semiconductor package according to the present invention.

FIG. 2 illustrates a BGA semiconductor package according to the present invention. The BGA semiconductor package according to the present invention is assembled by bonding a lower substrate 51 and an upper substrate 71.

Figure 3A:
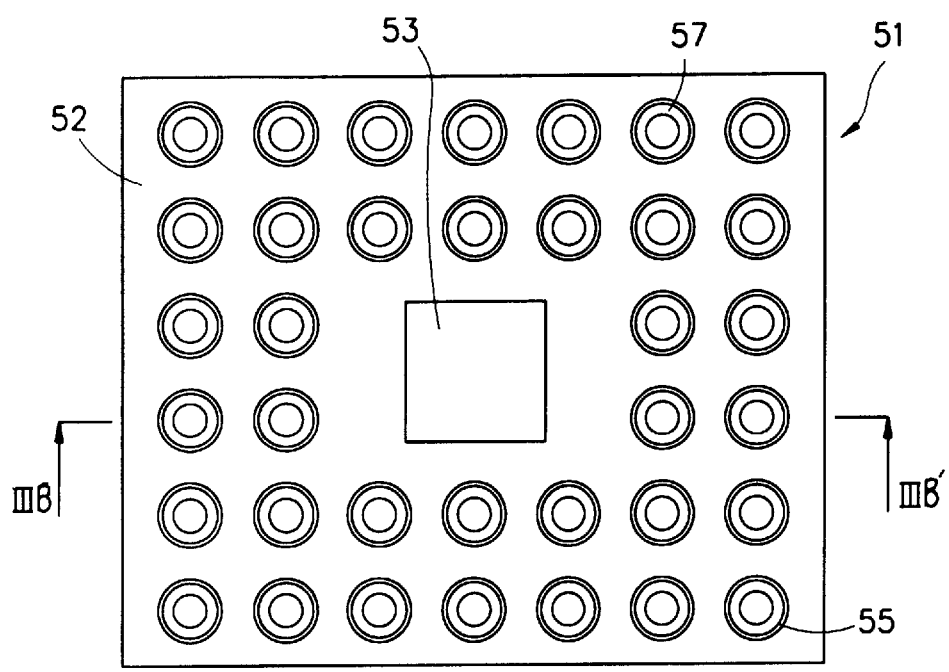
FIG. 3A is a top view illustrating a lower substrate according to the present invention.
Figure 3B:
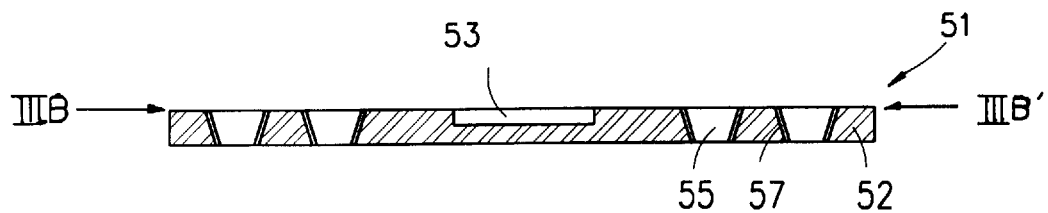
FIG. 3B is a cross-sectional view taken along the line IIIB—IIIB of FIG. 3A.

FIG. 3A illustrates a top view of the lower substrate 51, and FIG. 3B illustrates a cross-sectional view taken along the line IIIB–IIIB' of FIG. 3A. The reference numerals in FIGS. 3A and 3B represent the same elements. As shown in FIG. 3A, the lower substrate 51 is formed of an insulating substrate 52, and a recess 53 is formed at the center portion of the upper surface of the insulating substrate 52. A plurality of small lower through holes 55 are formed at the outermost portions of the insulating substrate 52 with respect to the recess 53.

In addition, as shown in FIG. 3B, the lower through holes 55 are formed conically in such a manner that the upper entrance portion is wider than the lower entrance portion. A an metallic thin film 57 coated with a metal such as titanium is formed on the inner wall of each of the lower through holes 55. As shown in FIG. 2, a plurality of conductive wiring portions 59, which act as a signal flow path for transmitting a signal from the semiconductor chip to an external circuit (for example, a circuit formed on the printed circuit board), are formed on the upper surface of the lower substrate 51 to be connected with the pads of the semiconductor chip and the conductive balls. The wiring portions 59 formed on the upper surface of the lower substrate 51 are electrically connected with the metallic thin film 57 formed on the inner wall of each of the lower through holes 55. Therefore, as shown in FIG. 2, the conductive balls 95 filled in the lower through holes 55 serve to transmit the signals inputted from the semiconductor chip 91 through the wiring portions 59 and the metallic thin film 57 to an externally connected circuit (not shown).

In another embodiment, the metallic thin film 57 is not formed on the inner wall of each of the lower through holes 55. More preferably, however, the metallic thin film 57 is formed for improving an electrical connection between the conductive balls 95 and the wiring portions 59.

When the conductive balls 95 are filled in the lower through holes 55 which do not have the metallic thin film on the inner wall, the wiring portions 59 formed on the upper surface of the insulation substrate 52 and extended from the recess 53 to the lower through holes 55 are directly connected with the conductive balls 95. It is thus possible to implement an electrical connection between the semiconductor chip, the wiring portions, and the conductive balls. However, since the contact area between the wiring portions and the conductive balls is small, reliability of the package may be decreased due to a bad connection between the wiring portions and the conductive balls. Therefore, the metallic thin film 57 is formed on the inner wall of each of the lower through holes 55, so that the wiring portions 59 of the upper surface of the insulation substrate 52 extend to the inner wall of each of the lower through holes 55. As a result, an electrical connection between the wiring portions 59 and the conductive balls is much improved. Therefore, the metallic thin film 57 is preferably formed on an inner wall of each of the lower through holes 55.

Figure 4A:
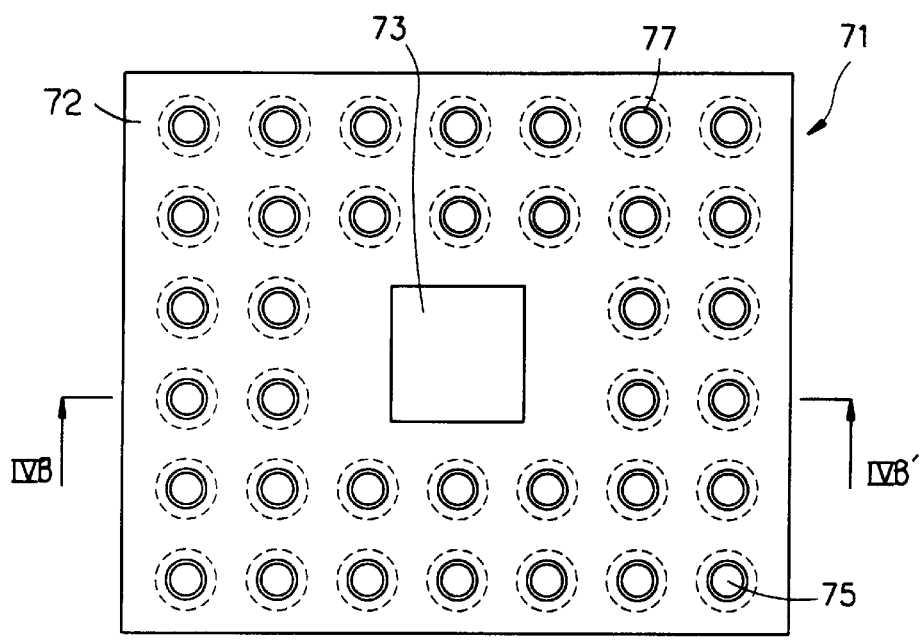
FIG. 4A is a top view illustrating an upper substrate according to the present invention.
Figure 4B:
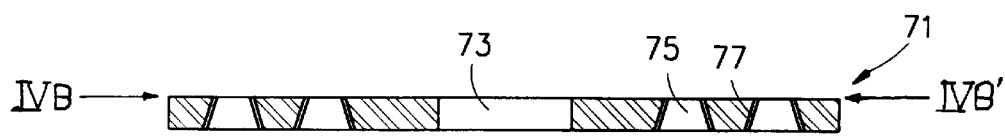
FIG. 4B is a cross-sectional view taken along the line IVB—IVB of FIG. 4A.

FIGS. 4A and 4B illustrate a top view of the upper substrate 71 and a cross-sectional view taken along the line IVB–IVB', respectively.

As shown in FIG. 4A, the upper substrate 71 is a frame type substrate having a pass-through portion 73 formed at the center portion of the insulating substrate 72. A plurality of small upper through holes 75 are formed on the insulating substrate 72 surrounding the pass-through portion 73. A metallic thin film 77 is formed on the inner wall of each of the upper through holes 75. The metallic thin film 77 on the inner wall of each of the upper through holes 75 is not required. However, it is preferable that the metallic thin film 77 is formed thereon. FIG. 4A illustrates a frame type upper substrate having a pass-through portion 73 formed in the center portion. Similar to the lower substrate 51, a predetermined shaped recess may be formed instead of the pass-through portion 73. In case that the upper substrate having a predetermined shaped recess is adapted, the entire thickness of the package after completing a packing process may be increased compared to the case when the upper substrate having the pass-through portion is adapted. In addition, the pass-through portion 73 of the upper substrate or the recess is formed at a portion corresponding to an encapsulating member which will be explained later. In FIG. 4B, the upper through holes 75 are conically formed, in which the lower entrance portion is wider than the upper entrance portion.

As shown in FIG. 2, the semiconductor chip 91 is mounted on the recess of the lower substrate 51, and the wires 93 are connected between the wiring portions 59 of the lower substrate 51 and the pads (not shown) of the semiconductor chip 91. The frame shape upper substrate 71 is mounted on the upper surface of the lower substrate 51. The lower entrance portions of the upper through holes 75 and the upper entrance portions of the lower through holes 55 of the lower substrate 51 are aligned. The conductive balls 95 are filled in the upper and lower through holes 75 and 55. The conductive balls 95 may protrude from the upper surface of the upper substrate 71.

Alternatively, the-conductive balls 95 may not protrude from the upper and lower surfaces of the upper substrate 71 and the lower substrate 51, respectively. However, it is more preferable that the conductive balls 95 protrude from at least one of the upper surface of the upper substrate and the lower surface of the lower substrate through holes 75 and 55. The conductive balls 95 are made of a solder having a low reflow temperature. In addition, the encapsulating member 97 encapsulates the wires 93 and the semiconductor chip 91.

The upper surface of the encapsulating member 97 is preferably formed to be lower than the height of the conductive balls 95. Otherwise, when two BGA packages are stacked, the conductive balls of the upper BGA package, if not protruding from the lower substrate, may be spaced apart from the conductive balls of the lower BGA package. Thus, it is more difficult to implement a signal transmission between the upper layer package and the lower layer package.

Figure 5:
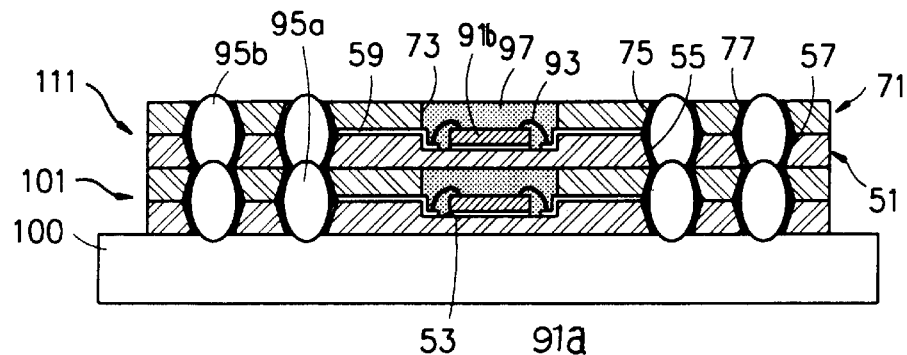
FIG. 5 is a cross-sectional view illustrating a stackable BGA semiconductor package according to the present invention.

FIG. 5 illustrates a structure of a stackable BGA semiconductor package according to the present invention. As shown therein, the upper BGA package 111 is stacked on the lower BGA package 101. The conductive balls 95a of the lower BGA package are connected with the conductive balls 95b of the upper BGA package, so that a signal is transmitted between the semiconductor chip 91b of the upper BGA package 111 and the semiconductor chip 91a of the lower BGA package 101. The conductive balls 95a of the lower BGA package 101 are connected with the bond pads (not shown) of a printed circuit board 100.

A fabrication method of the BGA semiconductor package according to the present invention will be explained as follows.

Figure 6A:
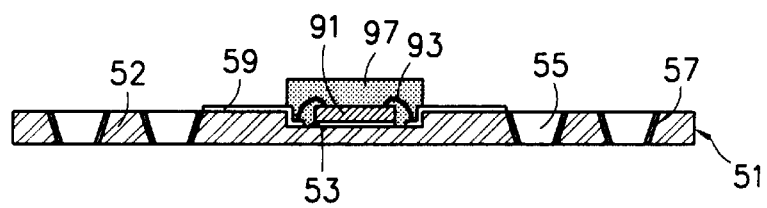
FIGS. 6A through 6C are cross-sectional views illustrating the process steps of fabricating method for a BGA semiconductor package according to the present invention.

As shown in FIG. 6A, the lower substrate 51 and the insulating substrate 52 are prepared in this order. The recess 53 is formed at the center portion of the upper surface of the insulating substrate 52. A metallic film is formed on the entire upper surface of the insulation substrate 52. A plurality of lower through holes 55 are formed on the upper surface. In the lower through holes 55, a diameter of the upper entrance portion is larger than that of the lower entrance portion. Thus, the lower through holes 55 each have an inverted conical shape.

Thereafter, a mask pattern is formed on the insulating substrate 52 to expose predetermined portions for forming through hole 55 thereon using a wet etching method. The exposed portion of the insulating substrate are etched by the wet etching method. In this case, since the upper portion of the insulating substrate 52 is more quickly etched than the lower portion, a through hole having an inverted conical shape is formed thereon. A metallic thin film 57, such as titanium, is coated on an inner wall of each of the through holes 55. The metallic film formed on the upper surface of the insulating substrate 52 is patterned to form a wiring portion 59.

Figure 6B:
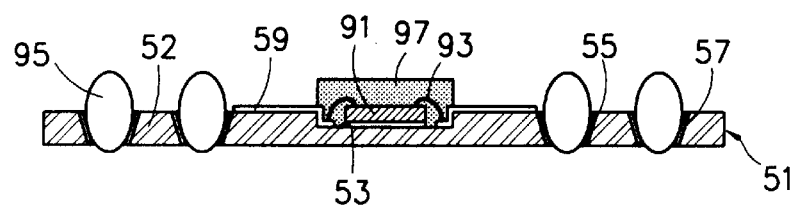

FIG. 6B shows a die bonding process. An adhesive is applied on the center portion of the recess of the lower substrate 51. Next, the pads (not shown) of the semiconductor chip 91 are connected with the wiring portions 59 using wires in a wiring process.

In an encapsulating process, the wires 93, the semiconductor chip 91, and the recess 53 are encapsulated by the encapsulating member 97. In the above-described encapsulating process, it is desirable to apply a molding process to decrease fabrication cost and improve productivity. Thereafter, the conductive balls 95 are placed on the through holes 55 of the lower substrate 51. To insert the conductive balls 95 into the through holes 55, the conductive balls 95 are placed on the lower substrate 51, and the lower substrate 51 is then shaken horizontally for stably mounting the conductive balls 95 on each one of the through holes 55. Therefore, a sophisticated additional apparatus or process step is not needed to mount the conductive balls on the through holes 55 in the present invention. Accordingly, the fabrication cost is decreased, and the assembling process is simplified in the present invention.

Figure 6C:
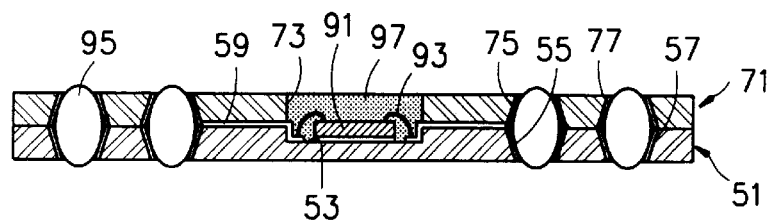

As shown in FIG. 6C, the frame type upper substrate 71 (shown in FIG. 3A) is mounted on the lower substrate 51 with an adhesive. Alternatively, the upper substrate (not shown) having a recess in the center portion of the lower surface may be attached on the lower substrate 51 with an adhesive. In this process, since the upper entrance portions of the upper through holes 75 formed on the upper substrate 71 are smaller than the lower entrance portion, the conductive balls 95 inserted between the upper through holes 75 of the upper substrate 71 and the lower through holes 55 of the lower substrate 51 are stably positioned between the upper and lower through holes 55 and 75.

In the method of fabricating the stackable BGA package according to the present invention, as shown in FIG. 5, the lower BGA package 101 is placed on a predetermined flat member. The conductive balls 95a of the lower BGA package 101 are aligned with the conductive balls 95b of the upper BGA package 111, and then the upper BGA package 111 is placed on the lower BGA package. Thereafter, the conductive balls 95a and 95b are connected using a reflow process to complete the fabrication of the stackable BGA semiconductor package.

As described above, the present invention provides for the low fabrication cost since an additional apparatus is not needed for mounting the conductive balls on the package substrate.

In addition, since the conductive balls protrude from the upper and lower surfaces of the substrate, a stackable package is realized in the present invention.

Furthermore, it is possible to mount more semiconductor chips on the limited area of the substrate compared to the related art, thereby allowing a smaller semiconductor package. Also, the present invention enhances reliability of the overall product since outer leads are not deformed against an external force.

It will be apparent to those skilled the art that various modification and variations can be made to a ball grid array semiconductor package and a method of fabricating the same according to the present invention without departing from the spirit or scope of the inventions. Thus, it is intended that the present invention provided they come within the scope of the appended claims and their equivalents.

What is claimed is:

1. A ball grid array semiconductor package, comprising:
   a first substrate having a plurality of first holes and a recess;
   a second substrate having a plurality of second holes and a third hole;
   a plurality of conductive balls connecting the first and second substrates by filling the first and second holes;
   a semiconductor chip on the recess of the first substrate;
   a first conductive wiring portion electrically connecting the semiconductor chip and the conductive balls; and
   an encapsulating member encapsulating the semiconductor chip, so that a top surface of the semiconductor chip is substantially completely covered with the encapsulating member.

2. The semiconductor package according to claim 1, wherein the first conductive wiring portion is formed on an upper surface of the first substrate.

3. The semiconductor package according to claim 1, wherein the conductive balls have portions protruding from at least one of the first and second substrates.

4. The semiconductor package according to claim 1, further comprising a wire electrically connecting the semiconductor chip and the first conductive wiring portion.

5. The semiconductor package according to claim 1, wherein the conductive balls include solder.

6. The semiconductor package according to claim 1, wherein the recess is positioned substantially at a center portion of the first substrate.

7. The semiconductor package according to claim 1, wherein the first holes have first and second end portions, the first end portion having an opening wider than the second end portion.

8. The semiconductor package according to claim 1, wherein the second holes have first and second end portions, the second end portion having an opening wider than the first end portion.

9. The semiconductor package according to claim 1, further comprising a second conductive wiring portion on inside walls of the first and second holes.

10. The semiconductor package according to claim 9, wherein the second conductive wiring portion includes titanium.

11. The semiconductor package according to claim 9, wherein the first conductive wiring portion has a first end placed on the recess and a second end connected to the second conductive wiring portion of the first substrate.

12. A stackable ball grid array semiconductor package, comprising:
   a first substrate having a plurality of first holes and a first recess;
   a second substrate having a plurality of second holes and a third hole;
   a plurality of first conductive balls filling the first and second holes;
   a first semiconductor chip on the first recess;
   a first conductive wiring portion electrically connecting the first semiconductor chip and the first conductive balls;
   a first encapsulating member encapsulating the first semiconductor chip;
   a third substrate having a plurality of fourth holes and a second recess;
   a fourth substrate having a plurality of fifth holes and sixth a hole;
   a plurality of second conductive balls filling the third and fourth holes, the first and second conductive balls being electrically connected each other;
   a second semiconductor chip on the second recess;
   a second conductive wiring portion electrically connecting the second semiconductor chip and the second conductive balls; and
   a second encapsulating member encapsulating the second semiconductor chip.

13. The semiconductor package according to claim 12, wherein the first and second conductive wiring portions are formed on upper surfaces of the first and second substrates, respectively.

14. The semiconductor package according to claim 12, wherein the first and second conductive balls have portions protruding from at least one of the first, second, third and fourth substrates.

15. The semiconductor package according to claim 12, further comprising a first wire electrically connecting the first semiconductor chip and the first conductive wiring portion, and a second wire electrically connecting the second semiconductor chip and the second conductive wiring portion.

16. The semiconductor package according to claim 12, wherein the first and second conductive balls include solder.

17. The semiconductor package according to claim 12, wherein the first conductive wiring portion has a first end placed on the first recess and a second end connected to the second conductive wiring portion of the first substrate.

18. The semiconductor package according to claim 12, wherein the first recess is positioned substantially at a center portion of the first substrate.

19. The semiconductor package according to claim 12, wherein the first holes have first and second end portions, the first end portion having an opening wider than the second end portion.

20. The semiconductor package according to claim 12, wherein the second holes have first and second end portions, the second end portion having an opening wider than the first end portion.

21. The semiconductor package according to claim 12, further comprising a third conductive wiring portion on inside walls of the first and second holes and a fourth conductive wiring portion of inside walls of the third and fourth holes.

22. The semiconductor package according to claim 21, wherein the third and fourth conductive wiring portions include titanium.

23. A method of fabricating a ball grid array semiconductor package, the method comprising the steps of:

preparing first and second substrates, the first substrate having a plurality of first holes and a first recess, and the second substrate having a plurality of second holes and a third hole;

attaching a first semiconductor chip on the first recess of the first substrate;

electrically connecting the first semiconductor chip to a first conductive wiring portion;

encapsulating the first semiconductor chip using a first encapsulating member, so that a top surface of the first semiconductor chip is substantially completely covered with the first encapsulating member;

mounting a plurality of first conductive balls on the first and second substrates through the first holes; and bonding the first and second substrates to form a first semiconductor package.

24. The method according to claim 23, further comprising the step of forming a second conductive wiring portion in inner walls of the first and second holes.

25. The method according to claim 23, wherein the first conductive balls have portions protruding from at least one of the first and second substrates.

26. The method according to claim 23, further comprising the steps of:

preparing third and fourth substrates, the third substrate having a plurality of fourth holes and a second recess, and the fourth substrate having a plurality of fifth holes and a sixth hole;

attaching a second semiconductor chip on the second recess of the third substrate;

electically connecting the second semiconductor chip to a third conductive wiring portion;

encapsulating the second semiconductor chip using a second encapsulating member;

mounting a plurality of second conductive balls on the third substrate through the fourth holes; and bonding the third and fourth substrates to form a second semiconductor package;

mounting the second semiconductor package on the first semiconductor package;

aligning the first and second conductive balls; and reflowing the first and second conductive balls to form the stackable ball grid array.

27. The method according to claim 26, further comprising the step of forming a fourth conductive wiring portion in inner walls of the third and fourth holes.

* * * * *